(12) United States Patent
Kadan

(10) Patent No.: US 11,538,966 B2
(45) Date of Patent: Dec. 27, 2022

(54) METHOD OF MANUFACTURING LIGHT EMITTING DEVICE

(71) Applicant: NICHIA CORPORATION, Anan (JP)

(72) Inventor: Katsuyoshi Kadan, Tokushima (JP)

(73) Assignee: NICHIA CORPORATION, Anan (JP)

( * ) Notice: Subject to any disclaimer, the term of this patent is extended or adjusted under 35 U.S.C. 154(b) by 19 days.

(21) Appl. No.: 16/838,697

(22) Filed: Apr. 2, 2020

(65) Prior Publication Data
US 2020/0321497 A1  Oct. 8, 2020

(30) Foreign Application Priority Data
Apr. 5, 2019  (JP) .............................. JP2019-073166

(51) Int. Cl.
| | | |
|---|---|---|
| *H01L 33/56* | (2010.01) | |
| *H01L 33/48* | (2010.01) | |
| *H01L 33/50* | (2010.01) | |
| *H01L 27/15* | (2006.01) | |

(52) U.S. Cl.
CPC ............ *H01L 33/56* (2013.01); *H01L 27/156* (2013.01); *H01L 33/486* (2013.01); *H01L 33/50* (2013.01); *H01L 2933/005* (2013.01); *H01L 2933/0041* (2013.01)

(58) Field of Classification Search
CPC ..... H01L 33/486; H01L 33/50; H01L 27/156; H01L 2933/0041; H01L 2933/005; H01L 2933/0066; H01L 25/0753; H01L 33/60; H01L 33/0095; H01L 33/52–56
See application file for complete search history.

(56) References Cited

U.S. PATENT DOCUMENTS

| | | | | |
|---|---|---|---|---|
| 2010/0141167 A1* | 6/2010 | Kato | ................ | G02F 1/133603 362/97.1 |
| 2012/0302124 A1* | 11/2012 | Imazu | ................... | H01L 33/486 445/58 |
| 2013/0187182 A1 | 7/2013 | Muramatsu et al. | | |
| 2015/0008455 A1* | 1/2015 | Tozawa | .............. | C08K 5/34924 257/88 |
| 2017/0062663 A1* | 3/2017 | Hayashi | ................ | H01L 33/486 |
| 2017/0062671 A1* | 3/2017 | Hashimoto | ........... | H01L 33/505 |

(Continued)

FOREIGN PATENT DOCUMENTS

| | | |
|---|---|---|
| JP | 2004-335629 A | 11/2004 |
| JP | 2005-183718 A | 7/2005 |

(Continued)

*Primary Examiner* — Jonathan Han
(74) *Attorney, Agent, or Firm* — Global IP Counselors, LLP

(57) ABSTRACT

A method of manufacturing a light emitting device, the method includes: preparing an intermediate structure including a supporter, a plurality of light emitting elements arranged on the supporter, a covering layer arranged on the supporter and surrounding the light emitting elements, and wiring electrodes each arranged on and straddling the covering layer and a corresponding one of the light emitting elements: preparing a board including light-reflective resin arranged on a surface of the board; pressing the intermediate structure against the light-reflective resin arranged on the board, with the wiring electrodes facing the light-reflective resin; curing the light-reflective resin to form a light-reflective resin layer; and removing the supporter.

16 Claims, 12 Drawing Sheets

(56) References Cited

U.S. PATENT DOCUMENTS

| | | | |
|---|---|---|---|
| 2017/0125654 A1* | 5/2017 | Bando | H01L 33/60 |
| 2017/0179344 A1 | 6/2017 | Matsuda | |
| 2018/0309034 A1 | 10/2018 | Ooyabu et al. | |
| 2019/0123236 A1 | 4/2019 | Matsuda | |
| 2019/0348587 A1 | 11/2019 | Ooyabu et al. | |

FOREIGN PATENT DOCUMENTS

| | | |
|---|---|---|
| JP | 2006-100444 A | 4/2006 |
| JP | 2007-012781 A | 1/2007 |
| JP | 2012-124443 A | 6/2012 |
| JP | 2013-153068 A | 8/2013 |
| JP | 2013-247301 A | 12/2013 |
| JP | 2017-118098 A | 6/2017 |
| WO | 2016/148019 A1 | 9/2016 |

\* cited by examiner

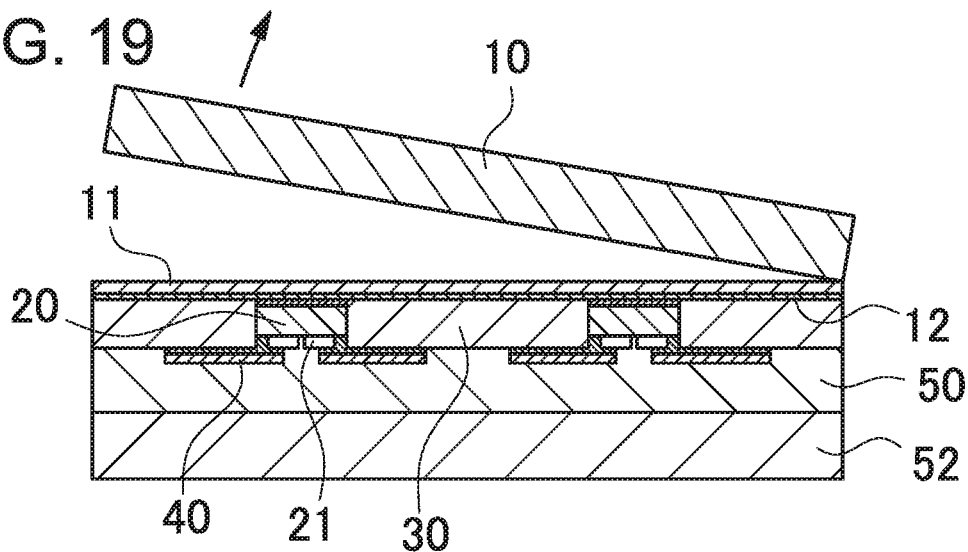
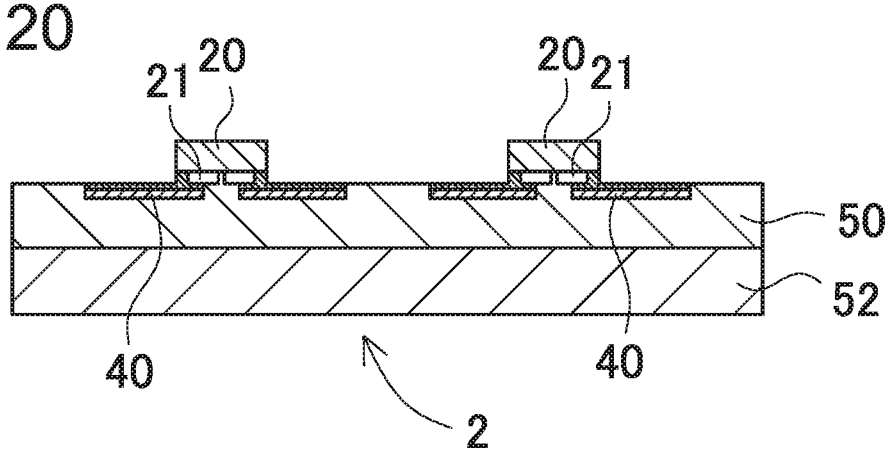
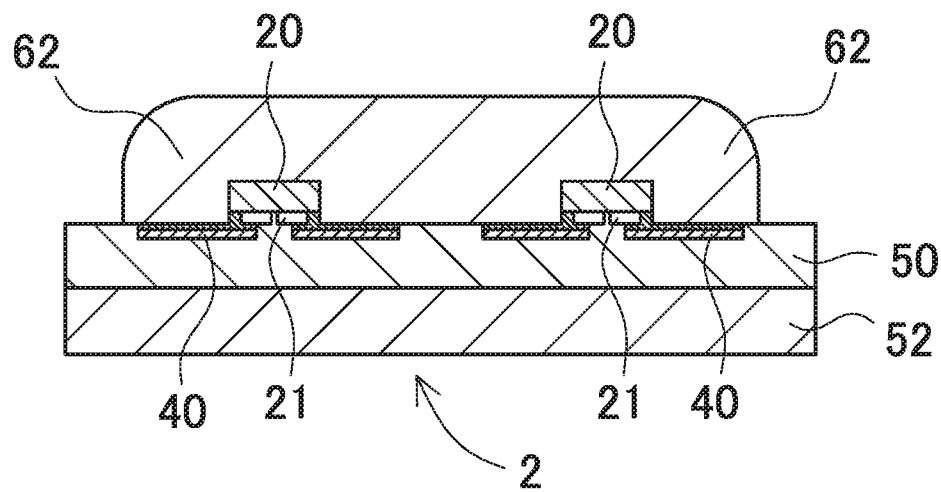

METHOD OF MANUFACTURING LIGHT EMITTING DEVICE

The present application claims priority under 35 U. S. C. § 119 to Japanese Patent Application No. 2019-073166, filed on Apr. 5, 2019, the content of which is incorporated herein by reference in their entirety.

BACKGROUND OF THE INVENTION

1. Field of the Invention

The present disclosure relates to a method of manufacturing a light emitting device.

2. Description of the Related Art

Light emitting devices that include light emitting elements such as light emitting diodes are widely used as backlights for liquid crystal displays, and light sources in various types of displays or the like. A light emitting device has been proposed which includes a light emitting element mounted on a board having wiring on its surface. For example, Japanese Patent Publication No. JP 2006-100444 discloses a light emitting device which includes a board having wiring on its upper surface, and a light emitting element having electrodes on its lower surface.

SUMMARY OF THE INVENTION

In recent years, a light emitting device is further required to be smaller and thinner.

It is an object of the present invention to provide a method of manufacturing a light emitting device which can be thinner.

A method of a light emitting device according to one aspect of the present invention includes: preparing an intermediate structure including a supporter, a plurality of light emitting elements arranged on the supporter, a covering layer arranged on the supporter and surrounding the light emitting elements, and wiring electrodes each arranged on and straddling the covering layer and a corresponding one of the light emitting elements; preparing a board including light-reflective resin arranged on a surface of the board; pressing the intermediate structure against the light-reflective resin arranged on the board, with the wiring electrodes facing the light-reflective resin; curing the light-reflective resin to form a light-reflective resin layer; and removing the supporter.

According to the method of a light emitting device according to this aspect of the present invention, a light emitting device which can be thinner is provided.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 19 is a cross-sectional view illustrating a process of removing the supporter;

FIG. 20 is a cross-sectional view illustrating a process of removing unnecessary parts;

FIG. 21 is a cross-sectional view illustrating a process of placing uncured adhesive resin over the light emitting elements;

DESCRIPTION OF EMBODIMENTS

Figure 1:
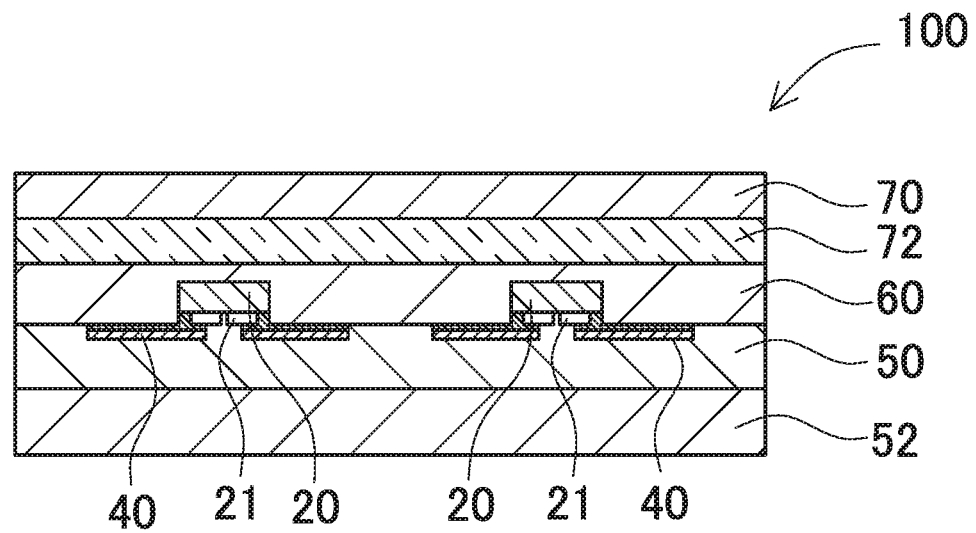
FIG. 1 is a cross-sectional view showing a light emitting device according to a first embodiment.

A method of manufacturing a light emitting device according to another aspect of the present invention can include the following features in addition to the aforementioned features.

In a method of manufacturing a light emitting device according to another aspect of the present invention, the pressing of the intermediate structure against the light-reflective resin can include pressing the intermediate structure against the light-reflective resin in an uncured or semi-cured state.

A method of manufacturing a light emitting device according to another aspect of the present invention can further include, after the removing of the supporter, applying uncured adhesive resin over the light emitting elements, placing a wavelength conversion sheet including a wavelength-conversion material on the uncured adhesive resin, and curing the adhesive resin to form an adhesion layer.

In a method of manufacturing a light emitting device according to another aspect of the present invention, the placing of the wavelength conversion sheet can include forming a light diffusion layer on a surface of the wavelength conversion sheet, and bringing the light diffusion layer of the wavelength conversion sheet to face and in contact with the uncured adhesive resin.

In a method of manufacturing a light emitting device according to another aspect of the present invention, the preparing of the board can include applying a thermosetting resin on the board as the light-reflective resin.

In a method of manufacturing a light emitting device according to another aspect of the present invention, the preparing of the board can include preparing an electrically insulating board as the board.

In a method of manufacturing a light emitting device according to another aspect of the present invention, the preparing of the board can include preparing a BN board as the board.

In a method of manufacturing a light emitting device according to another aspect of the present invention, the preparing of the intermediate structure can include arranging the light emitting elements in two or more of rows and two or more columns on the supporter.

In a method of manufacturing a light emitting device according to another aspect of the present invention, the preparing of the intermediate structure can include arranging the light emitting elements located in a central area of the supporter at a fixed interval and the light emitting elements located in a peripheral area of the supporter at an interval smaller than the fixed interval.

In a method of manufacturing a light emitting device according to another aspect of the present invention, the preparing of the board and the curing of the light-reflective resin can include forming the light-reflective resin layer having a thickness in a range from 100 µm to 200 µm.

In a method of manufacturing a light emitting device according to another aspect of the present invention, the preparing of the board can include preparing the board having a thickness in a range from 100 µm to 200 µm.

The embodiments will now be described with reference to the accompanying drawings, wherein like reference numerals designate corresponding or identical elements throughout the various drawings.

In the following description, although terms for indicating particular directions or positions (e.g., "upper" and "lower", and other terms including these terms) will be used as necessary for ease of understanding the present with reference to the drawings, the technical scope of the present invention is not limited by these terms. Portions attached with the same reference sign in different drawings show the portions or members same as or similar to each other.

It should be appreciated, however, that the embodiments described below are illustrations of a method of manufacturing a light emitting device to give a concrete form to technical ideas of the invention, and a method of manufacturing a light emitting device of the invention is not specifically limited to description below. Unless otherwise specified, any dimensions, materials, shapes and relative arrangements of the parts described below are given as an example and not as a limitation. In addition, the description for one embodiment may be applied to other embodiments or examples. Additionally, the sizes and the arrangement relationships of the members in the drawings are occasionally exaggerated for ease of explanation.

Light Emitting Device

FIG. 1 is a cross-sectional view showing a light emitting device 100 according to a first embodiment of the present invention. The illustrated light emitting device includes a plurality of light emitting elements 20, a light-reflective resin layer 50, a board 52, an adhesion layer 60, a light diffusion layer 72, and a wavelength conversion sheet 70.

Light Emitting Element 20

The light emitting element 20 has an electrode formation surface 20a and a light emission surface 20b (discussed later with reference to FIG. 7). Positive/negative element electrodes 21 are formed on the electrode formation surface 20a. The light emission surface 20b is located opposite to the electrode formation surface 20a. The light emitting element 20 is mounted directly or through bump or the like on upper surfaces of wiring electrodes 40 in a flip-chip mounting manner, that is, the element electrodes 21 contact the upper surfaces of the wiring electrodes 40.

Semiconductor light emitting elements can be used as the light emitting elements 20. In this embodiment, the flip-chip-mounted light emitting diodes are illustratively used as the light emitting elements 20. The light emitting elements 20 emit blue light, for example. Elements which emit light other than blue can be also used as the light emitting elements 20. Also, two or more light emitting elements which emit light with different colors can be used as the light emitting elements 20. The color of light emitted by the light emitting element 20 is adjusted to a desired color to be emitted outward by the wavelength conversion member.

Elements which emit light having any wavelength can be selectively used as the light emitting elements 20. For example, light emitting elements which are formed of nitride group semiconductors ($In_xAl_yGa_{1-x-y}N$, $0 \leq x$, $0 \leq y$, $x+y \leq 1$) or GaP can be used as an element which emits blue or green light. Light emitting elements which are formed of semiconductors such as GaAlAs and AlInGaP can be used as an element which emits red light. Semiconductor light emitting devices can also be used which are formed of materials other than these materials. The light wavelength of a semiconductor layer can be varied by changing the mixture ratio between its materials. The composition, the light color, the size, the number, and the like of the light emitting elements to be used can be suitably selected depending on the purpose.

The light emitting elements 20 are arranged in two or more rows and two or more columns in a matrix arrangement on the main surface (i.e., light extraction surface) of the light emitting device. This type of light emitting device is strongly required to be thin but have reduced bow. For this reason, a method of manufacturing a light emitting device according to this embodiment is suitably applied to such a light emitting device. The light emitting elements 20 can be arranged in a grid arrangement. Alternatively, the light emitting elements in one row may be offset from the light emitting elements in the adjacent row. Also, the light emitting elements may be arranged in any suitable arrangement including line arrangement, radial arrangement, and spiral arrangement. The number of the light emitting elements 20, or rows or columns of the matrix arrangement can be adjusted depending on requirements such as the size, density, light amount, and the like of a flat light source to which the light emitting elements are applied. An exemplary arrangement of the light emitting elements 20 in a light emitting device 200 according to a second embodiment is shown in a plan view of FIG. 2.

Figure 2:
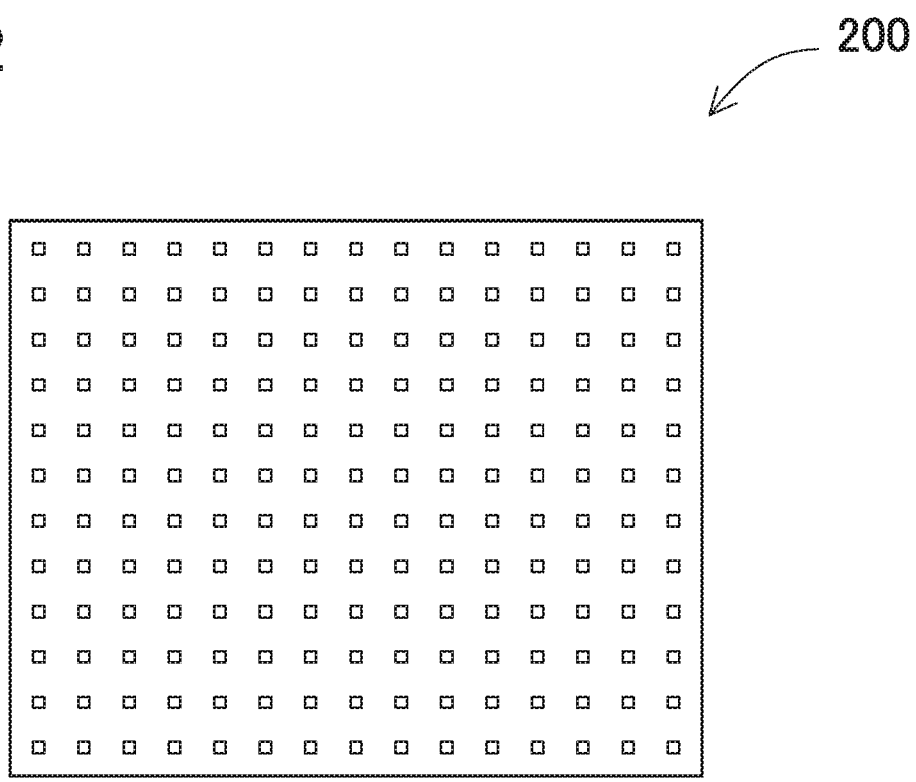
FIG. 2 is a plan view showing a light emitting device according to a second embodiment.
Figure 3:
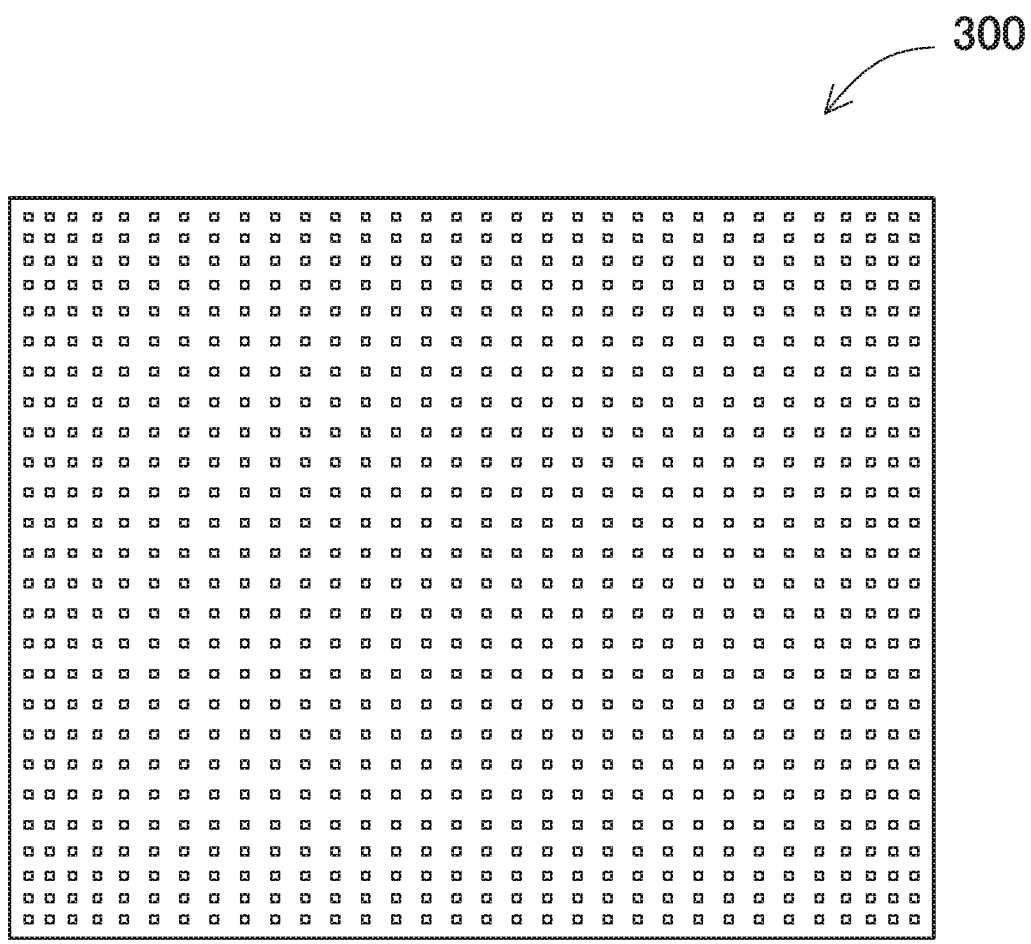
FIG. 3 is a plan view showing a light emitting device according to a third embodiment.

Although the light emitting elements 20 are spaced apart from each other at a fixed interval in the matrix arrangement shown in FIG. 2, the interval between the light emitting elements can be varied depending on parts of the light emitting device. For example, in the case in which a number of light emitting elements 20 are arranged in the light emitting device, corner areas of the light emitting device are likely to be less bright while a central area of the light emitting device is likely to be bright. In this case, the brightness will be varied depending on parts of the light emitting device. In other words, luminance unevenness will occur. To address this luminance unevenness, the light emitting elements that are located in the peripheral area can be spaced apart from each other at an interval smaller than an interval between the light emitting elements that are located in the central area (the density of the light emitting elements in the peripheral area can be higher than in the central area). This type of light emitting device is shown as a light emitting device 300 according to a third embodiment in a plan view of FIG. 3. In the case in which a number of light emitting elements 20 are arranged in the light emitting device, the corner area will be less bright relative to the central area. To reduce such luminance difference, the light emitting elements in the central area are spaced apart from each other at a fixed interval and the light emitting elements in the corner area are spaced apart from each other at an interval smaller than the fixed interval, that is, the interval between the light emitting elements 20 in the corner is smaller than the central area as shown in FIG. 3. This arrangement can avoid such low brightness in the corner area of the light emitting device. As a result, a uniformly bright flat light source can be provided which has uniform brightness as a whole.

Figure 4:
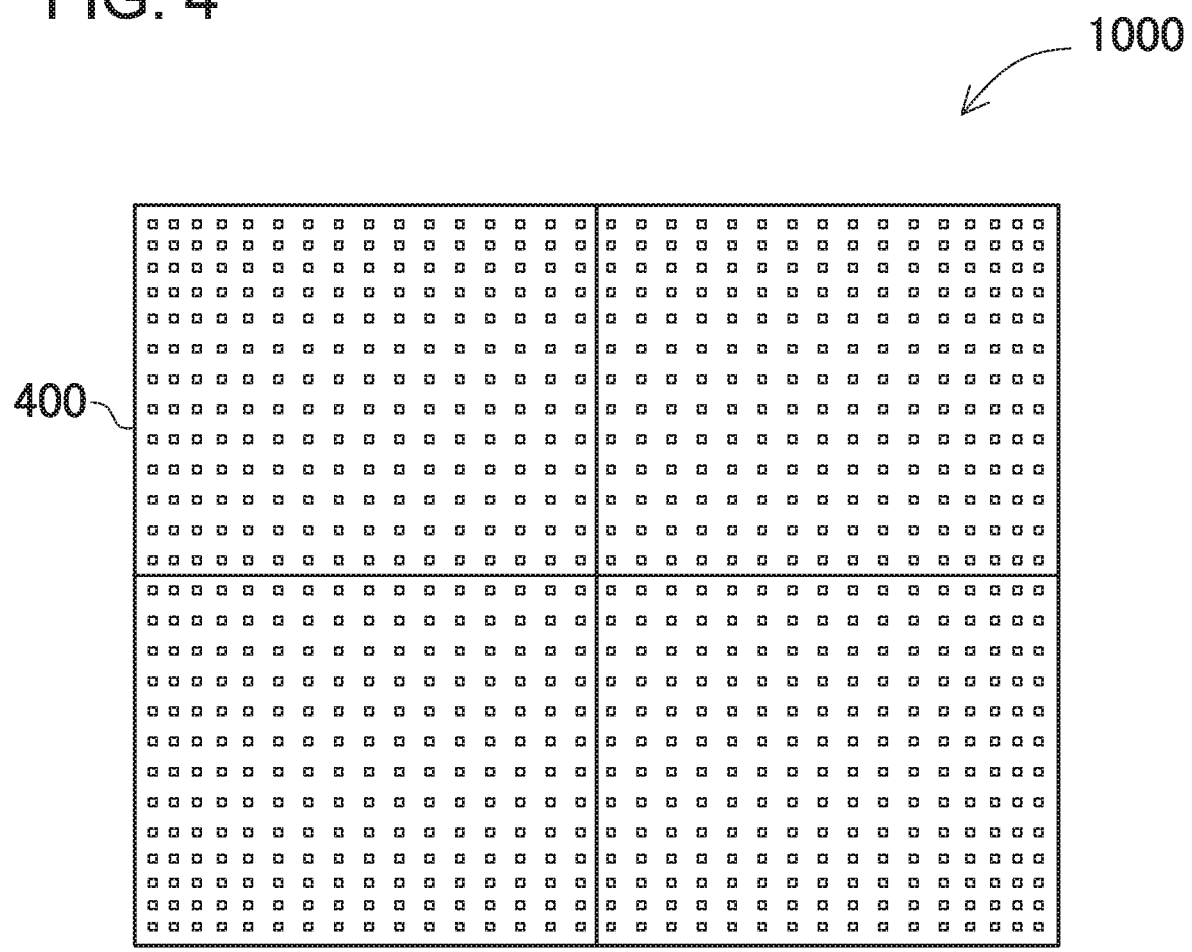
FIG. 4 is a plan view showing a light emitting device according to a fourth embodiment.
Figure 5:
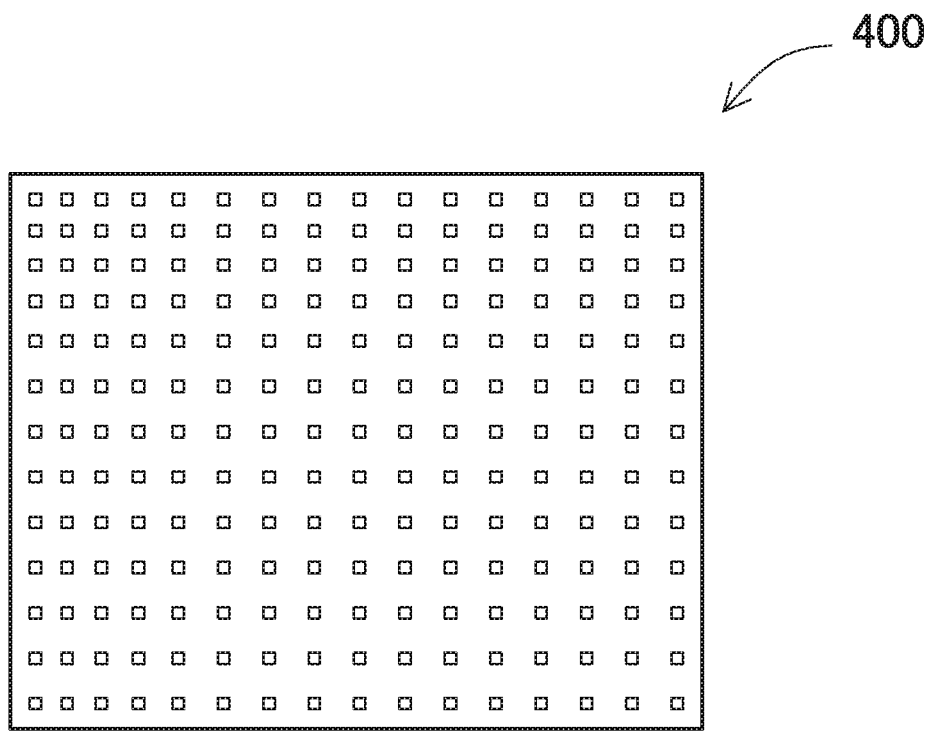
FIG. 5 is an enlarged partial plan view showing a light emitting device shown in FIG. 4.

Although the light emitting device 300 shown in FIG. 3 has been illustratively described to solely serve as a uniformly bright flat light source, a flat light source as a light emitting device assembly can be constructed of two or more light emitting devices. Such light emitting devices are shown as a light emitting device assembly 1000 according to a fourth embodiment in a plan view of FIG. 4. The light emitting device assembly 1000 shown in FIG. 4 is constructed of four light emitting devices. One of the four light emitting devices (light emitting device 400) in the light emitting device assembly 1000 shown in a plan view of FIG. 5. More specifically, the light emitting device 400 is located on the upper left of FIG. 4. The interval between rows of the light emitting element 20 which are arranged in a matrix arrangement becomes smaller toward the top so that the density of the light emitting elements 20 becomes high on the upper left of the light emitting device 400 shown in FIG. 5. Similarly, the interval between columns of the light emitting element 20 becomes smaller toward the left. According to this arrangement, a large flat light source can be provided by two or more light emitting devices in conjunction with each other while avoiding low brightness in the corner areas of the large flat light source. As a result, a uniformly bright flat light source can be provided which has uniform brightness as a whole.

Light-Reflective Resin Layer 50

The light-reflective resin layer 50 serves as a mount board having an upper surface on which the light emitting elements 20 are mounted. The light-reflective resin layer 50 is preferably formed of a heat and light resistant thermosetting resin as light-reflective resin 51. For example, silicone, epoxy, and the like can be suitably used for the light-reflective resin 51. The thickness of the light-reflective resin layer 50 falls within a range from 15 μm to 300 μm.

Board 52

The board 52 supports the light-reflective resin layer 50. If the light-reflective resin layer 50 is thin, a bow or wrinkles may appear. The present inventors have conducted a test on the light-reflective resin layer and found that a bow appears if the light-reflective resin layer 50 has a thickness about 400 μm, and such a bow may cause a trouble in the following manufacturing processes or the like. In recent years, light emitting devices are strongly required to be smaller. Even in the case in which the light-reflective resin layer is used for light sources for liquid crystal displays, they are required to have a thickness smaller than 300 μm in order to realize a liquid crystal display which is thin similar to organic electroluminescence displays which include no backlight. To address this, the light emitting elements 20 are not supported only by the light-reflective resin layer 50 but by the light-reflective resin layer 50 and the board 52 which is attached onto the light-reflective resin layer 50 to reduce such a bow. In other words, the board 52 serves as a reinforcement layer or board. The thickness of the board 52 falls within a range from 25 μm to 200 μm. An electrically insulating board is suitably used as the board 52 because such an electrically insulating board can be easily handled. More specifically, a BN (boron nitride) board which is polyimide-impregnated glass cloth is preferably used for the board 52 because a bow or wrinkles are less likely to appear.

Adhesion Layer 60

The adhesion layer 60 optically connects the wavelength conversion sheet 70, which includes the light diffusion layer 72, to the light emitting elements 20. The adhesion layer 60 is light transmissive, and fixes the light diffusion layer 72 and the light emitting element 20 to each other so that they are optically connected to each other. If an air gap is formed between the light emitting element 20 and the wavelength conversion sheet 70, the light entry efficiency from the light emitting element 20 into the wavelength conversion sheet 70 is reduced. As a result, the light extraction efficiency is reduced. To avoid this, an adhesive of resin is applied over the external shape of the light emitting element 20 so that such an air gap is filled with the adhesive which is attached to the wavelength conversion sheet 70, which includes the light diffusion layer 72. Thermosetting resins such as silicone, epoxy, and the like can be suitably used for the adhesion layer 60.

Light Diffusion Layer 72

The light diffusion layer 72 diffuses or scatters light that is emitted by the light emitting elements 20, and guides the light into the wavelength conversion sheet 70. The light diffusion layer can avoid concentration of light in parts of the main surface in which the light emitting elements 20 are located. Accordingly, luminance unevenness can be reduced. More specifically, observers are less likely to feel bright dots, in other words, recognize brighter parts corresponding to the light emitting elements 20. As a result, a uniformly bright flat light source can be provided. The light diffusion layer 72 is formed of a resin and light diffusion particles which are distributed in the resin. Inorganic particles such as $TiO_2$, $SiO_2$, $Al_2O_3$, or glass filler can be suitably used as the light diffusion particles. The light diffusion particles can be white resin or metal fine particles which are obtained by processing white resin or metal as light-reflection material. The light diffusion particles are included at random in a base material. Accordingly, light is repeatedly reflected at random when passing through the light diffusion layer 72. The passing light will be diffused in many directions. That is, the light is prevented from concentrating in a particular area. As a result, luminance unevenness can be prevented. Thermosetting resins such as silicone resin and epoxy resin can be suitably used as the resin of the light diffusion layer 72. The light diffusion layer preferably has reflectance of not smaller than 60%, more preferably not smaller than 90% of the light from the light emitting element 20. It is noted that the light diffusion layer 72 may be omitted depending on the structure and uses of the light emitting device (details will be discussed later).

Wavelength Conversion Sheet 70

The wavelength conversion sheet 70 includes a wavelength conversion material which can convert light that is emitted by the light emitting elements 20 into light having a different wavelength. The wavelength conversion sheet 70 can be a sheet which includes the wavelength conversion material distributed in a base material. An example of the wavelength conversion material can be provided by a phosphor. Exemplary materials of the wavelength conversion material can be provided YAG phosphor, β-SIALON phosphor, or fluoride group phosphor (e.g., KSF group phosphor), and the like. The wavelength conversion sheet 70 can include one wavelength conversion material, or two or more wavelength conversion materials. Such two or more wavelength conversion materials to be included in the wavelength conversion sheet 70 can include a β-SIALON phosphor which emits green range light and a fluoride group phosphor (e.g., KSF group phosphor) which emits red range light, for example. These phosphors can provide a wider color reproduction range to the light emitting device 100. In this case, the light emitting element 20 preferably include a nitride group semiconductor ($In_xAl_yGa_{1-x-y}N$, $0 \le x$, $0 \le y$, $x+y \le 1$) which can emit light in the short wavelength range capable of efficiently exciting the wavelength conversion sheet 70. In the case in which the light emitting elements 20 emitting blue range light are used, for example, the wavelength conversion sheet can include not smaller than 60%, preferably 90% by weight of KSF group phosphor (red phosphor) so that the light emitting device sufficiently emits red range light. That is, in order to provide particular color light, the wavelength conversion sheet can include a wavelength conversion material which emits particular color light. The wavelength conversion material may be quantum dots. The wavelength conversion material may be included in any arrangement in the wavelength conversion sheet 70. For example, the wavelength conversion material may be substantially uniformly or unevenly distributed. Two or more layers which include different wavelength conversion materials may be laminated on one after another.

A matrix formed of resin can be used as the base material in which a wavelength conversion material is distributed. Exemplary materials of the resin material can be provided by light-transmissive materials such as epoxy resin, silicone resin, mixed resin of these resins, glass, and the like. Silicone resin is advantageously used as the base material of the light conversion material from the viewpoint of light resistance and ease of formation.

Method of Manufacturing Light Emitting Device

With reference to FIGS. 6 to 22, a method of manufacturing the light emitting device is now described. An intermediate structure 1 shown in FIG. 6 is first prepared.

Intermediate Structure 1

Figure 6:
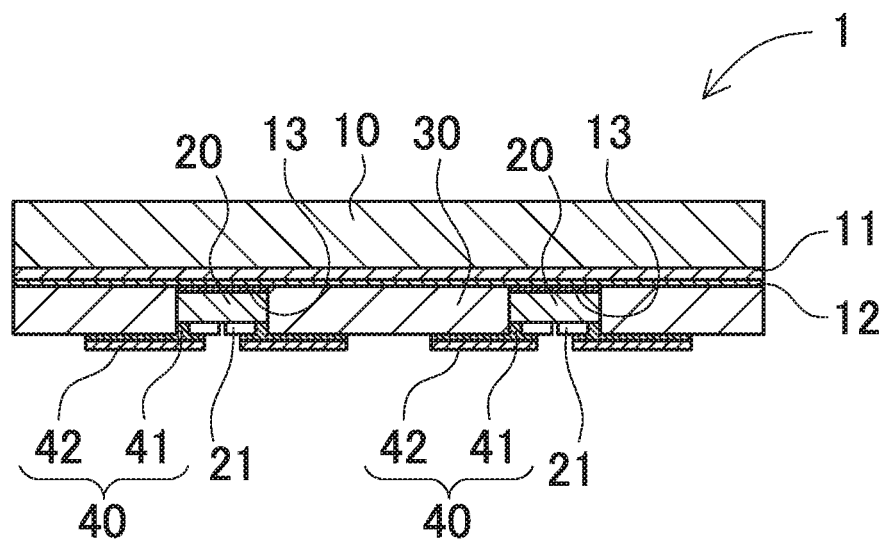
FIG. 6 is a cross-sectional view showing an intermediate structure.

The intermediate structure 1 shown in FIG. 6 includes a supporter 10, a plurality of light emitting elements 20 which are arranged on the supporter 10, a covering layer 30 which is arranged on the supporter 10 and surrounds the light emitting elements 20, and wiring electrodes 40 which are arranged on and straddle the covering layer 30 and their corresponding light emitting element 20. With reference to FIGS. 7 to 15, a process of producing the intermediate structure 1 is now described.

Step of Arranging Light Emitting Elements 20

Figure 7:
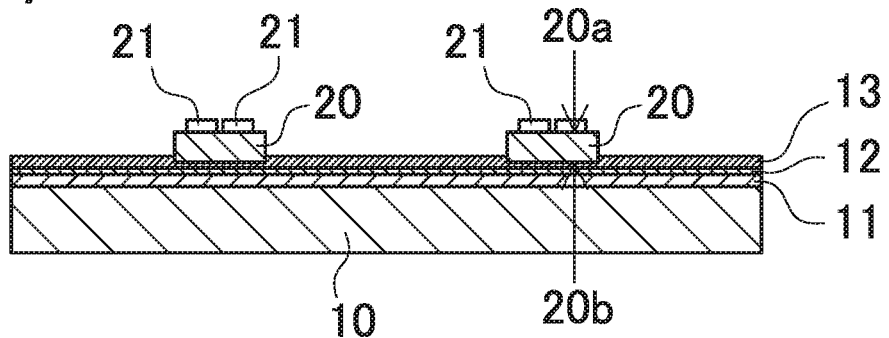
FIG. 7 is a cross-sectional view illustrating a process of placing light emitting elements onto a supporter.

The light emitting elements 20 are first arranged on the supporter 10 as shown in FIG. 7. Specifically, the electrode formation surface 20a faces upward, and the light emission surface 20b faces downward in the arrangement of the light emitting elements 20. The light emitting elements 20 can be spaced apart from each other at a certain interval in the intermediate structure 1. In this case, in a step of forming the wiring electrodes 40 discussed later, the element electrodes 21 of one light emitting element 20 can be electrically connected to the element electrodes of other light emitting elements 20 by the wiring electrodes 40.

The light emitting elements 20 can be placed on the supporter 10. For example, a glass board, a sapphire board, and the like can be suitably used for the supporter 10. Although the shape of the supporter 10 is not specifically limited, the supporter 10 preferably has a flat upper surface. The supporter 10 is bonded to the light emitting elements 20 by a second adhesion layer 13. VPA or the like can be used as the second adhesion layer 13, for example.

A photosensitive resin layer is formed as a release layer 11 on an upper surface of the supporter 10. The second adhesion layer 13 is formed on a protection layer 12 which is formed on the upper surface of the release layer 11, in other words, the protection layer 12 is formed between the second adhesion layer 13 and the release layer 11. The release layer 11 can separate the light emitting elements 20 from the supporter 10 when irradiated with light in a later step.

Figure 8:
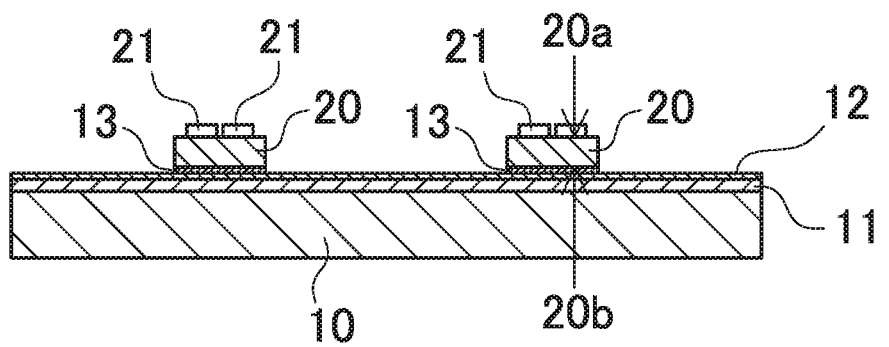
FIG. 8 is a cross-sectional view illustrating a process of removing a second adhesion layer other than mount areas of the light emitting elements.

Subsequently, as shown in FIG. 8, the second adhesion layer 13 in an area other than the mount areas of the light emitting elements 20 is removed by etching. The protection layer 12 serves to prevent removal of the release layer 11 by etching. A metal is preferably used for the protection layer 12. More specifically, Ti or the like can be used as the metal of the protection layer 12.

Step of Forming Covering Layer 30

Figure 9:
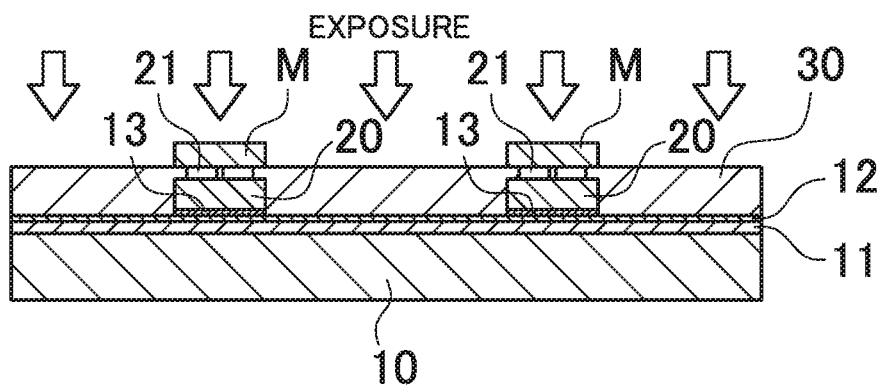
FIG. 9 is a cross-sectional view illustrating a process of forming a covering layer.

Subsequently, the covering layer 30 is arranged on the supporter 10 and surrounds the light emitting elements 20, as shown in FIG. 9. To form the covering layer 30, a material of the covering layer 30 is applied on the supporter 10. The covering layer 30 can be applied by spin coating by using a spin coater or discharging by using a dispenser, and the like. However, application of the covering layer is not limited to these. The covering layer 30 is preferably formed of an organic material. In this case, the covering layer 30 can be easily removed by etching in a later-discussed step of removing the covering layer. Polyimide (PI) can be used as the organic material, for example.

Figure 10:
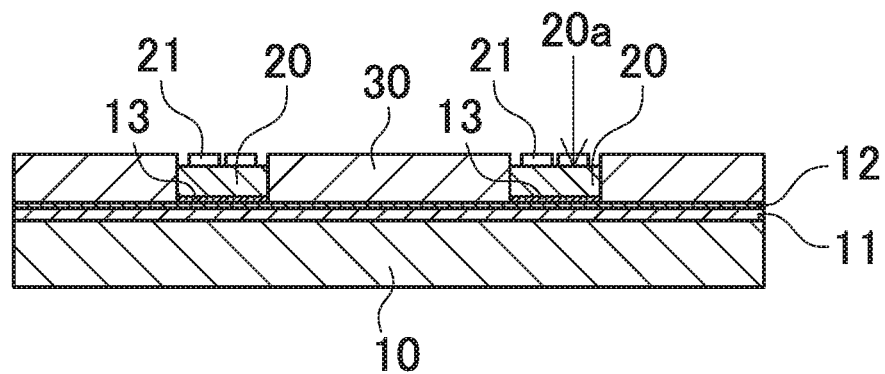
FIG. 10 is a cross-sectional view illustrating a process of forming openings through which electrode formation surfaces of the light emitting elements are exposed.

For example, in the case in which a resist is used as the covering layer 30, as shown in FIG. 9, after the resist covers the supporter 10 and the light emitting element 20, masks M are formed in a shape which covers the upper part of their corresponding light emitting element 20, and the resist is developed by light. Accordingly, openings through which the electrode formation surfaces 20a of the light emitting elements 20 are exposes are formed as shown in FIG. 10.

Step of Forming Wiring Electrodes 40

Subsequently, the wiring electrodes 40 are formed to straddle the covering layer 30 and their corresponding element electrodes 21 of the light emitting element 20. The wiring electrodes 40 are formed of a first metal layer 41 and a second metal layer 42 which is arranged on the first metal layer 41.

Figure 11:
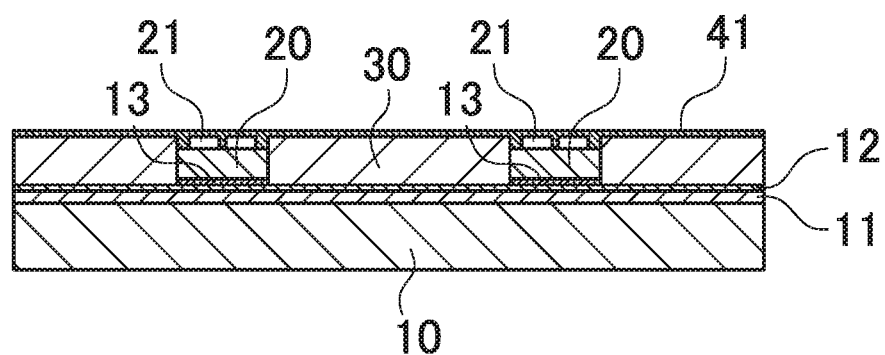
FIG. 11 is a cross-sectional view illustrating a process of forming a first metal layer.

In a step of forming the wiring electrodes 40, as shown in FIG. 11, the first metal layer 41 is first formed on substantially the entire surfaces of the element electrodes 21 of the light emitting element 20 and the covering layer 30 by sputtering or the like. The first metal layer 41 is used as a seed layer for forming the second metal layer 42 by electroplating in a step of forming the second metal layer 42 which is conducted after the first metal layer 41 is formed. An exemplary structure of the first metal layer 41 can be provided by an Al/Ti/Cu structure in which Al, Ti, and Cu layers are formed from the supporter 10 side in this order, for example.

Figure 12:
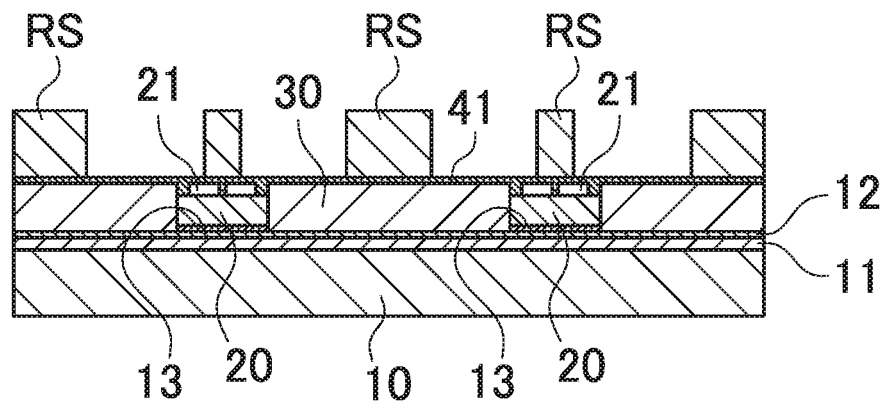
FIG. 12 is a cross-sectional view illustrating a process of forming a resist on the first metal layer.

Subsequently, as shown in FIG. 12, a resist RS is formed on the first metal layer 41. The resist RS has openings which at least partially expose the element electrodes 21 in a plan view. In other words, the resist RS is arranged so as not to entirely overlap the element electrodes 21 in the plan view.

Figure 13:
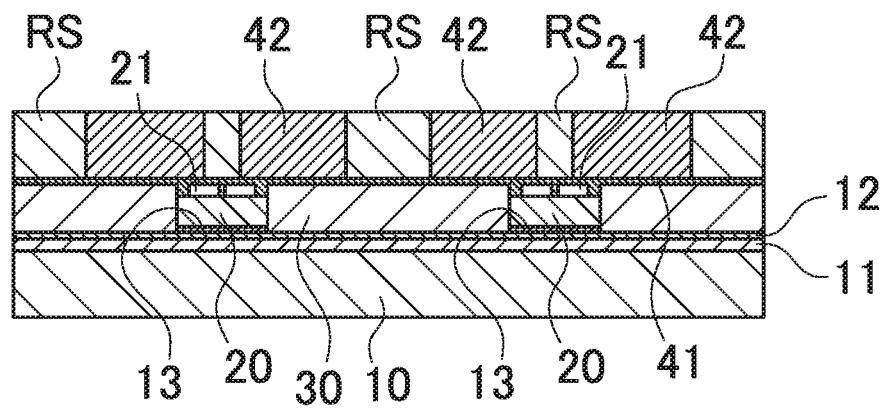
FIG. 13 is a cross-sectional view illustrating a process of forming a second metal layer in openings of the resist.

Subsequently, as shown in FIG. 13, the second metal layer 42 is formed in the openings of the resist RS by electroplating. The first metal layer 41 serves as a seed layer for electroplating, that is, an electric current path so that the second metal layer 42 is grown in the openings of the resist RS in the plating. An example for material of the second metal layer 42 can be Cu, for example.

Figure 14:
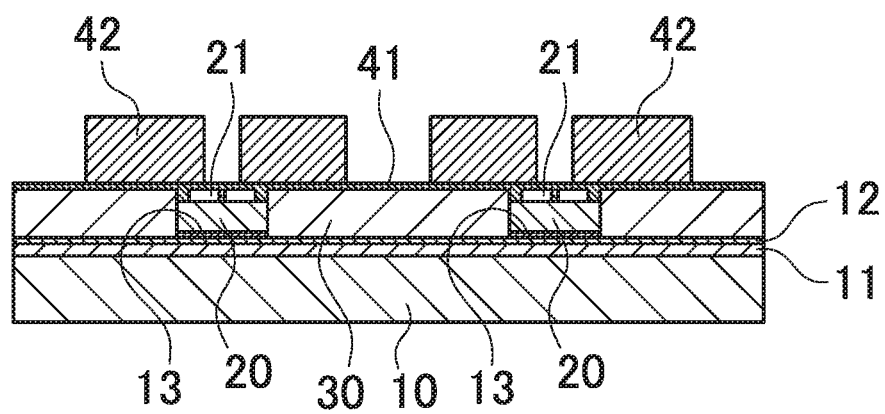
FIG. 14 is a cross-sectional view illustrating a process of removing the resist.

Subsequently, the resist RS is removed as shown in FIG. 14. Accordingly, the second metal layer 42 as parts of the wiring electrodes 40 is formed.

Figure 15:
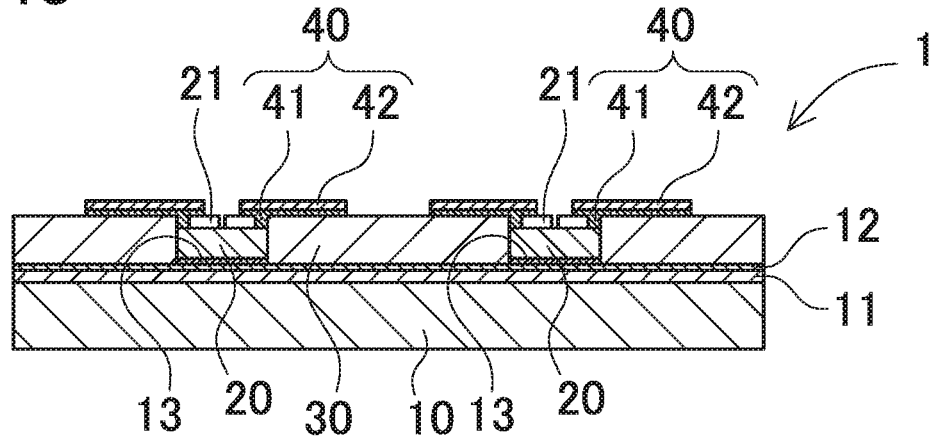
FIG. 15 is a cross-sectional view illustrating a process of forming wiring electrodes by removing the second and first metal layers.

Subsequently, as shown in FIG. 15, a part of the second metal layer 42 is partially removed by etching so that the second metal layer 42 is thinned, and the first metal layer 41 in areas in which the second metal layer 42 is not formed is also removed by the etching. As a result, the wiring electrodes 40 which are constructed of the laminated first and second metal layers 41 and 42 are formed so that each of the wiring electrodes 40 straddles the covering layer 30 and a corresponding one of the element electrodes 21 of the light emitting element 20. Third and fourth metal layers may be additionally formed as second wiring electrodes on the wiring electrodes 40.

Because the wiring electrodes 40 are formed and positioned with respect to the element electrodes 21 of the light emitting elements 20 as discussed above, even if the position of the light emitting elements 20 is deviated in the step of arranging the light emitting elements 20, the position of the wiring electrodes 40 can be adjusted. Accordingly, the possibility of poor connection can be reduced which is caused by such positional deviation between the element electrodes 21 of the light emitting element 20 and the wiring electrodes 40 as compared with the case in which light emitting elements are formed and positioned with respect to wiring electrodes provided on a board.

Figure 16:
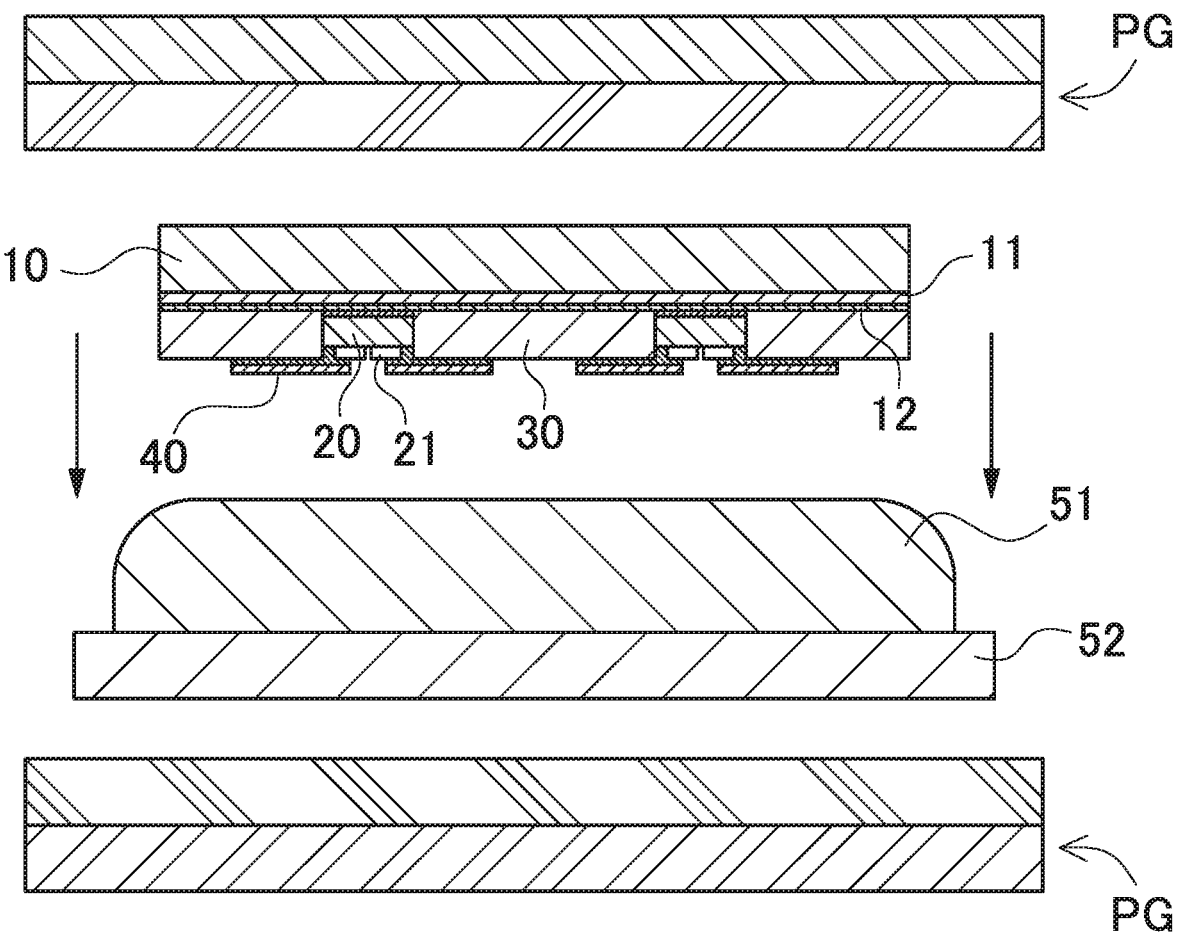
FIG. 16 is a cross-sectional view illustrating a process of pressing the intermediate structure against light-reflective resin.

The intermediate structure 1 is produced as discussed above. Additionally, the board 52 on which the light-reflective resin 51 is applied is also prepared. The intermediate structure 1 is reversed so that the wiring electrodes 40 face the light-reflective resin 51, and then pressed against the light-reflective resin 51 as shown in FIG. 16. More specifically, the board 52 (e.g., BN board) is placed on a wafer such as base glass board which is formed by sheet-transferring. The intermediate structure 1 is bonded to the board 52 which is placed on the wafer by the light-reflective resin layer 50. The intermediate structure 1 is preferably pressed against the board 52 in a vacuum when bonded onto the board 52. Accordingly, because the light-reflective resin layer 50 and the board 52 can be attached together onto the intermediate structure 1, even if the light-reflective resin layer 50 is thinner, a bow or wrinkles are unlikely to appear. In this embodiment, the intermediate structure 1 is pressed against the light-reflective resin 51 which is not cured (in uncured state) or is in a semi-cured state, in other words, against uncured or semi-cured light-reflective resin. In this specification, "semi-cured state" refers to a state in which a curing process of resin is stopped at a middle phase. The "semi-cured light-reflective resin" (light-reflective resin in a semi-cured state) refers to a light-reflective resin which is in the midpoint of its curing phase and can be further cured by heating. The glass board is used to press the intermediate structure against the light-reflective resin in the embodiment shown in FIG. 16. A PET sheet for release or the like is preferably formed on a surface of the press glass board PG.

Figure 17:
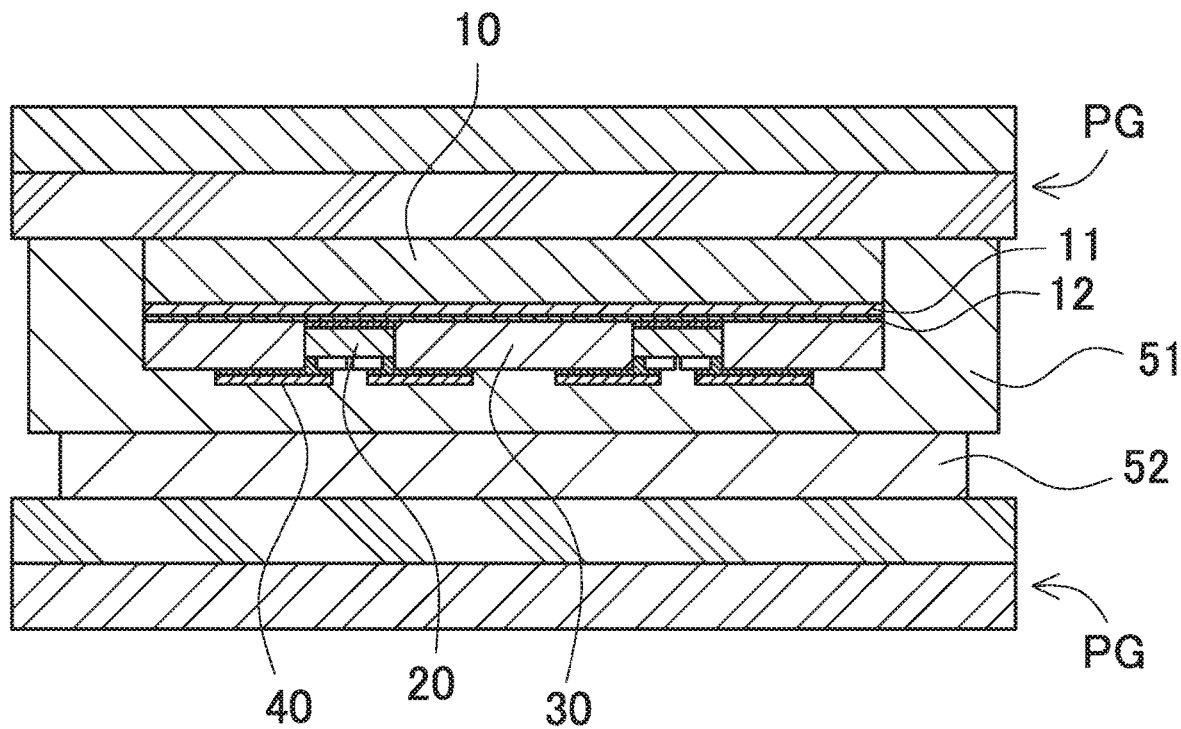
FIG. 17 is a cross-sectional view illustrating a process of curing the light-reflective resin under pressure from the intermediate structure.
Figure 18:
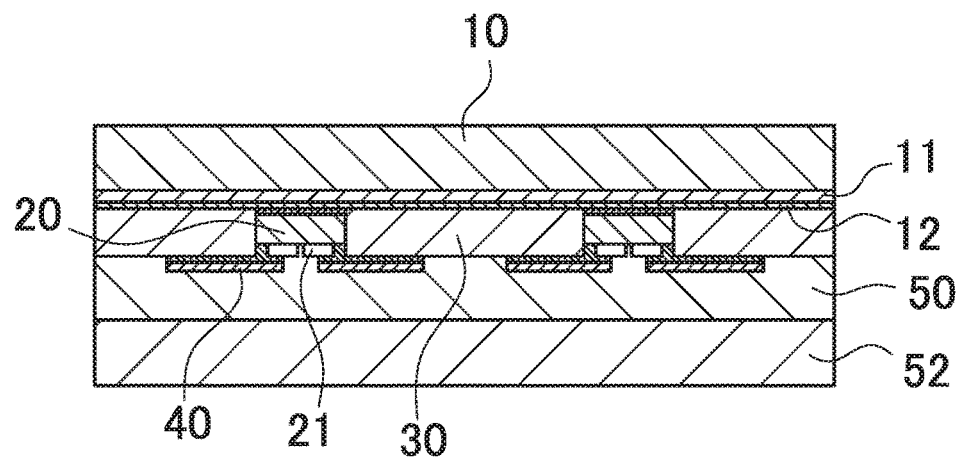
FIG. 18 is a cross-sectional view illustrating a process of removing redundant parts.

Subsequently, the light-reflective resin 51 is cured and becomes the light-reflective resin layer 50. More specifically, the light-reflective resin 51 is cured under pressure as shown in FIG. 17. In the case in which the light-reflective resin 51 is a thermosetting resin such as silicone resin as discussed above, the light-reflective resin 51 is heated. For example, the light-reflective resin 51 is heated at 150° C. for several hours. After the press glass board PG is released, an excess part of the light-reflective resin or the like is removed as shown in FIG. 18. Although the light-reflective resin layer 50 is previously applied onto the board 52 in this embodiment, the light-reflective resin 51 may be applied onto the intermediate structure 1, and the board may be attached to the light-reflective resin 51.

Subsequently, the supporter 10 is removed. In this embodiment, the glass board as the supporter 10 is removed by laser lift off as shown in FIG. 19. The release layer 11 is previously formed on the supporter 10 to easily release the supporter 10.

Unnecessary parts including the release-layer 11 are additionally removed. In this embodiment, as shown in FIG. 20, polyimide resin as the covering layer 30 is removed by RIE (reactive ion etching). After that, the light emitting device 2 which includes a plurality of light emitting elements 20 on the board 52 is manufactured.

The wavelength conversion sheet 70 can be additionally formed in the light emitting device 2. After the aforementioned step of removing the supporter 10, uncured adhesive resin 62 is applied to cover the light emitting elements 20, and the wavelength conversion sheet 70 which includes a wavelength conversion material is placed on the adhesive resin 62. In this embodiment, as shown in FIG. 21, uncured adhesive resin 62 is applied to cover the light emitting elements 20, and the wavelength conversion sheet 70 which includes a wavelength conversion material is placed on the adhesive resin 62. Silicone resin which is a thermosetting resin is used as the adhesive resin 62. The light diffusion layer 72 may be formed in the wavelength conversion sheet 70 before placing the wavelength conversion sheet on the adhesive resin. The light diffusion layer 72 of the wavelength conversion sheet 70 is placed onto the uncured adhesive resin 62.

Figure 22:
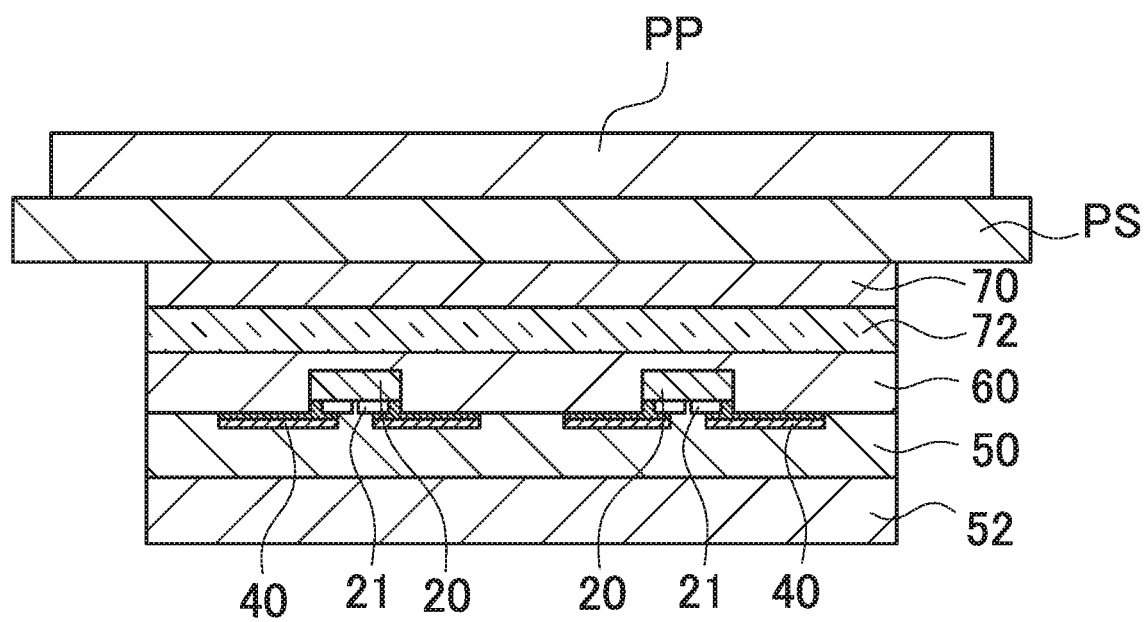
FIG. 22 is a cross-sectional view illustrating a process of placing a wavelength conversion sheet onto uncured adhesive resin and a process of forming an adhesion layer by curing the adhesive resin.

Subsequently, the adhesive resin 62 is cured and becomes the adhesion layer 60. In this embodiment, the wavelength conversion sheet 70 is pressed by a release sheet PS by using a press board PP as shown in FIG. 22, and then placed in an oven to be heated. Finally, the light emitting device 100 shown in FIG. 1 is manufactured. According this construction, because the light emitting element 20 and the light diffusion layer (the wavelength conversion sheet 70) can be connected by the adhesion layer 60, no air gap is formed in the connection part between the light emitting element and the light diffusion layer (the wavelength conversion sheet). Therefore, light can be efficiently emitted from the light emitting device. It is found from inventors' test that light emission efficiency of the light emitting device is improved 20% to 40% as compared with a construction in which a diffusion sheet or a wavelength conversion sheet 70 is attached without the adhesion layer 60.

Figure 23:
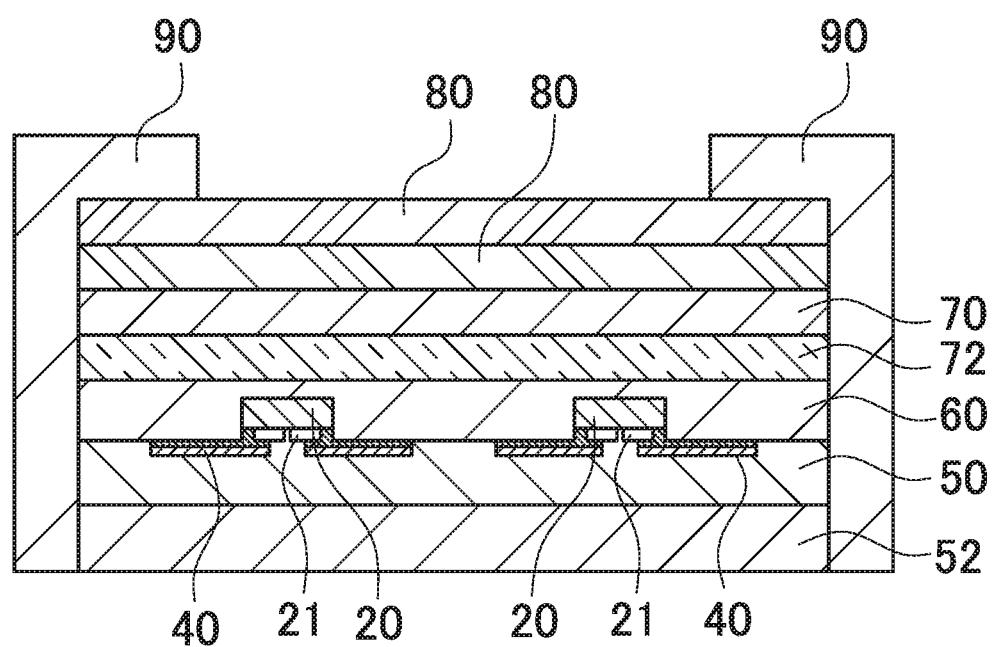
FIG. 23 is a cross-sectional view showing a light emitting device including an additional member.

Additional components such as optical sheet 80 and case 90 can be added if necessary. For example, in the case in which the light emitting device is used as a flat backlight light source for liquid crystal displays, a sheet polarizer is required. This type of light emitting device is shown in a cross-sectional plan view of FIG. 23. In this embodiment, the optical sheets 80 are additionally arranged on the light emitting device shown in FIG. 1, and the case 90 covers the side surfaces of this light emitting device.

The optical sheet 80 is used for backlights of liquid crystal displays. One optical sheet can be solely used, or a plurality of optical sheet can be used in conjunction with each other. Examples of the optical sheets 80 can be provided by polarizing film, color filter, lens sheet, light diffusion sheet (e.g., BEF series (trade name of 3M Company), OptSaver (registered trademark), L-series (trade name of KIMOTO Co., Ltd.), and the like.

The case 90 is a housing which protects external side surfaces of the light emitting device. In this embodiment, the side surfaces of the optical sheets 80 which are placed on the upper surface of the light emitting device are tightly held by the case 90 formed of resin. Such additional components (e.g., optical sheet 80 and case 90) can be added depending on uses of the light emitting device.

Figure 24:
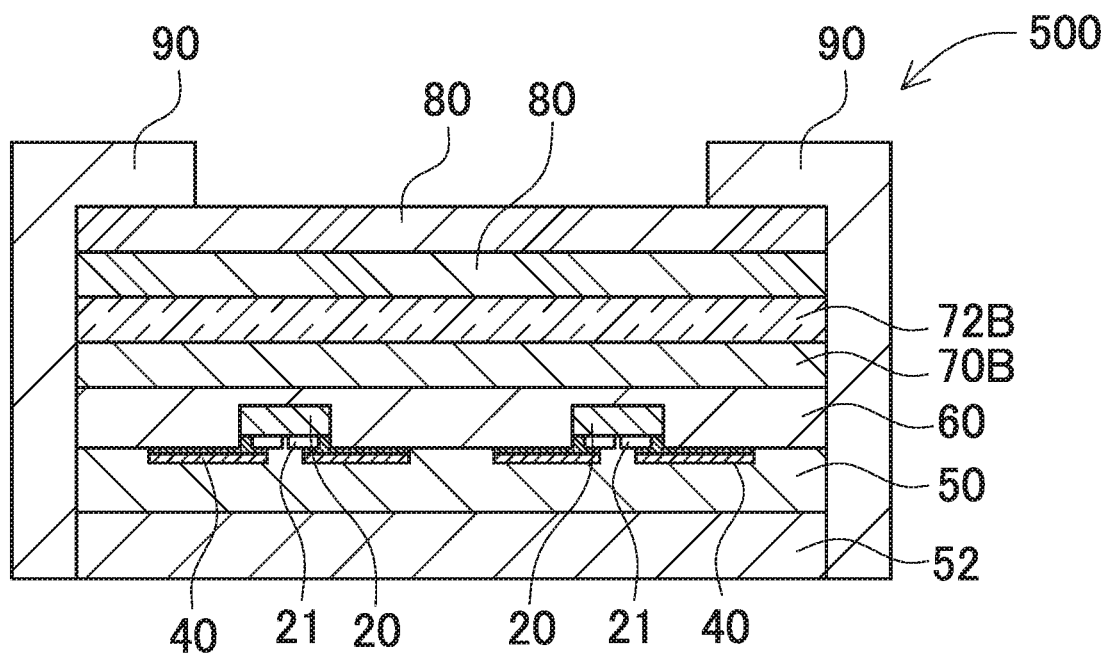
FIG. 24 is a cross-sectional view showing a light emitting device according to a fifth embodiment.

A light emitting device 500 according to a fifth embodiment will now be described. The wavelength conversion sheet 70 and the light diffusion layer 72 as discussed above may be modified. This type of light emitting device according to the fifth embodiment is now described as the light emitting device 500 with reference to a cross-sectional view of FIG. 24. In the illustrated light emitting device 500, a wavelength conversion sheet 70B is directly coupled to the board 52, to which the light emitting element 20 is attached, by the adhesion layer 60 without the light diffusion layer between the wavelength conversion sheet 70B and the adhesion layer 60. In the case in which the light emitting device is used for a flat backlight light source for liquid crystal displays, an light diffusion sheet 72B and the optical sheets 80 are arranged on the upper surface of the wavelength conversion sheet 70B, and held by the case 90 if necessary. According to this construction, light after wavelength conversion by the wavelength conversion sheet 70 is diffused. As a result, observers are less likely to feel bright dots corresponding to the light emitting elements 20. That is, luminance unevenness can be reduced.

The light emitting device according to the present disclosure can be suitably used as backlights of televisions, tablets, and liquid crystal display devices for televisions, tablets, smart phones, smart watches, head-up displays, digital signages, signboards, and the like. Also, the light emitting device according to the present disclosure can be used as light sources for lighting, as well as emergency lights, line lighting, various types of illuminations, car monitors, and the like.

It should be apparent to those with an ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the scope of the invention as defined in the appended claims.

What is claimed is:

1. A method of manufacturing a light emitting device, the method comprising:
   preparing an intermediate structure including
      a supporter having a first surface and a second surface opposite to the first surface,
      a plurality of light emitting elements arranged on the supporter, each of the light emitting elements having a side surface, the plurality of light emitting elements including a first light emitting element and a second light emitting element,
      a covering layer continuously and directly covering the first surface of the supporter, the side surface of the first light emitting element and the side surface of the second light emitting element, the covering layer having a top surface, and
      wiring electrodes each arranged on and straddling the top surface of the covering layer and a corresponding one of the light emitting elements;
   preparing a board including light-reflective resin arranged on a surface of the board;
   pressing the intermediate structure against the light-reflective resin arranged on the board, with the wiring electrodes facing the light-reflective resin;
   curing the light-reflective resin to form a light-reflective resin layer; and removing the supporter, wherein
   each of the plurality of light emitting elements has element electrodes each having an upper surface and a side surface, and
   the wiring electrodes cover the upper surface of each of the element electrodes at least partially and the side surface of each of the element electrodes at least partially.

2. The method of manufacturing a light emitting device according to claim 1, wherein the pressing of the intermediate structure against the light-reflective resin includes pressing the intermediate structure against the light-reflective resin in an uncured or semi-cured state.

3. The method of manufacturing a light emitting device according to claim 1, further comprising
   after the removing of the supporter,
      applying uncured adhesive resin over the light emitting elements, placing a wavelength conversion sheet including a wavelength-conversion material on the uncured adhesive resin, and curing the adhesive resin to form an adhesion layer.

4. The method of manufacturing a light emitting device according to claim 2, further comprising after the removing of the supporter,
applying uncured adhesive resin over the light emitting elements,
placing a wavelength conversion sheet including a wavelength-conversion material on the uncured adhesive resin, and
curing the adhesive resin to form an adhesion layer.

5. The method of manufacturing a light emitting device according to claim 3,
wherein
the placing of the wavelength conversion sheet includes
forming a light diffusion layer on a surface of the wavelength conversion sheet, and
bringing the light diffusion layer of the wavelength conversion sheet to face and in contact with the uncured adhesive resin.

6. The method of manufacturing a light emitting device according to claim 4,
wherein
the placing of the wavelength conversion sheet includes
forming a light diffusion layer on a surface of the wavelength conversion sheet, and
bringing the light diffusion layer of the wavelength conversion sheet to face and in contact with the uncured adhesive resin.

7. The method of manufacturing a light emitting device according to claim 1, wherein the preparing of the board includes applying a thermosetting resin on the board as the light-reflective resin.

8. The method of manufacturing a light emitting device according to claim 1, wherein the preparing of the board includes preparing an electrically insulating board as the board.

9. The method of manufacturing a light emitting device according to claim 1, wherein the preparing of the board includes preparing a BN board as the board.

10. The method of manufacturing a light emitting device according to claim 1, wherein the preparing of the intermediate structure includes arranging the light emitting elements in two or more of rows and two or more columns on the supporter.

11. The method of manufacturing a light emitting device according to claim 10, wherein the preparing of the intermediate structure includes arranging the light emitting elements located in a central area of the supporter at a fixed interval and the light emitting elements located in a peripheral area of the supporter at an interval smaller than the fixed interval.

12. The method of manufacturing a light emitting device according to claim 1, wherein the preparing of the board and the curing of the light-reflective resin includes forming the light-reflective resin layer having a thickness in a range from 100 μm to 200 μm.

13. The method of manufacturing a light emitting device according to claim 1, wherein the preparing of the board includes preparing the board having a thickness in a range from 100 μm to 200 μm.

14. The method of manufacturing a light emitting device according to claim 1, further comprising
removing the covering layer at the same time or after the removal of the supporter.

15. A method of manufacturing a light emitting device, the method comprising:
preparing an intermediate structure including
a supporter having a first surface and a second surface opposite to the first surface,
a plurality of light emitting elements arranged on the supporter, each of the light emitting elements having a side surface and element electrodes each having an upper surface and a side surface,
a covering layer arranged on the first surface of the supporter and covering the side surface of each of the light emitting elements and filling the space between adjacent ones of the light emitting elements, the covering layer having a top surface, and
wiring electrodes each arranged on and straddling the top surface of the covering layer and a corresponding one of the light emitting elements and covering the upper surface of each of the element electrodes at least partially and the side surface of each of the element electrodes at least partially;
preparing a board including light-reflective resin arranged on a surface of the board;
pressing the intermediate structure against the light-reflective resin arranged on the board, with the wiring electrodes facing the light-reflective resin;
curing the light-reflective resin to form a light-reflective resin layer;
removing the supporter; and
removing the covering layer at the same time or after the removal of the supporter.

16. A method of manufacturing a light emitting device, the method comprising:
preparing an intermediate structure including
a supporter having a first surface and a second surface opposite to the first surface,
a plurality of light emitting elements arranged on the supporter, each of the light emitting elements having a side surface and element electrodes each having an upper surface and a side surface,
a covering layer arranged on the first surface of the supporter and covering the side surface of each of the light emitting elements and filling the space between adjacent ones of the light emitting elements, the covering layer having a top surface, and
wiring electrodes each arranged on and straddling the top surface of the covering layer and a corresponding one of the light emitting elements and covering the upper surface of each of the element electrodes at least partially and the side surface of each of the element electrodes at least partially;
preparing a board including light-reflective resin arranged on a surface of the board;
pressing the intermediate structure against the light-reflective resin arranged on the board, with the wiring electrodes facing the light-reflective resin;
curing the light-reflective resin to form a light-reflective resin layer; and
removing the supporter.

* * * * *